United States Patent
Liu et al.

(10) Patent No.: US 10,775,694 B1
(45) Date of Patent: Sep. 15, 2020

(54) APPARATUS FOR MOUNTING A PELLICLE TO A PHOTOMASK AND METHOD FOR MOUNTING A PELLICLE TO A PHOTOMASK

(71) Applicant: TAIWAN SEMICONDUCTOR MANUFACTURING COMPANY LTD., Hsinchu (TW)

(72) Inventors: Tzu Han Liu, Tainan (TW); Chih-Wei Wen, Tainan (TW); Chung-Hung Lin, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/399,046

(22) Filed: Apr. 30, 2019

(51) Int. Cl.
*G03B 27/64* (2006.01)
*G03F 1/64* (2012.01)
*G03F 1/38* (2012.01)

(52) U.S. Cl.
CPC . *G03F 1/64* (2013.01); *G03F 1/38* (2013.01)

(58) Field of Classification Search
CPC ..... G03F 1/64; G03F 1/62; G03F 1/66; G03F 1/38; G03F 7/70983
See application file for complete search history.

(56) References Cited

U.S. PATENT DOCUMENTS

| | | | |
|---|---|---|---|
| 6,507,390 B1* | 1/2003 | Ivaldi | G03F 1/64 355/75 |
| 2014/0253898 A1* | 9/2014 | Lee-Chih | G03F 1/62 355/72 |

* cited by examiner

*Primary Examiner* — Peter B Kim
(74) *Attorney, Agent, or Firm* — WPAT, P.C., Intellectual Property Attorneys; Anthony King

(57) ABSTRACT

The present disclosure provides an apparatus for mounting a pellicle to a photomask, including a cover having a first side and a second side opposite to the first side, wherein the second side is configured to face the photomask, and an air pad disposed between the first side and the second side, wherein the air pad comprises a compartment filled with air.

20 Claims, 19 Drawing Sheets

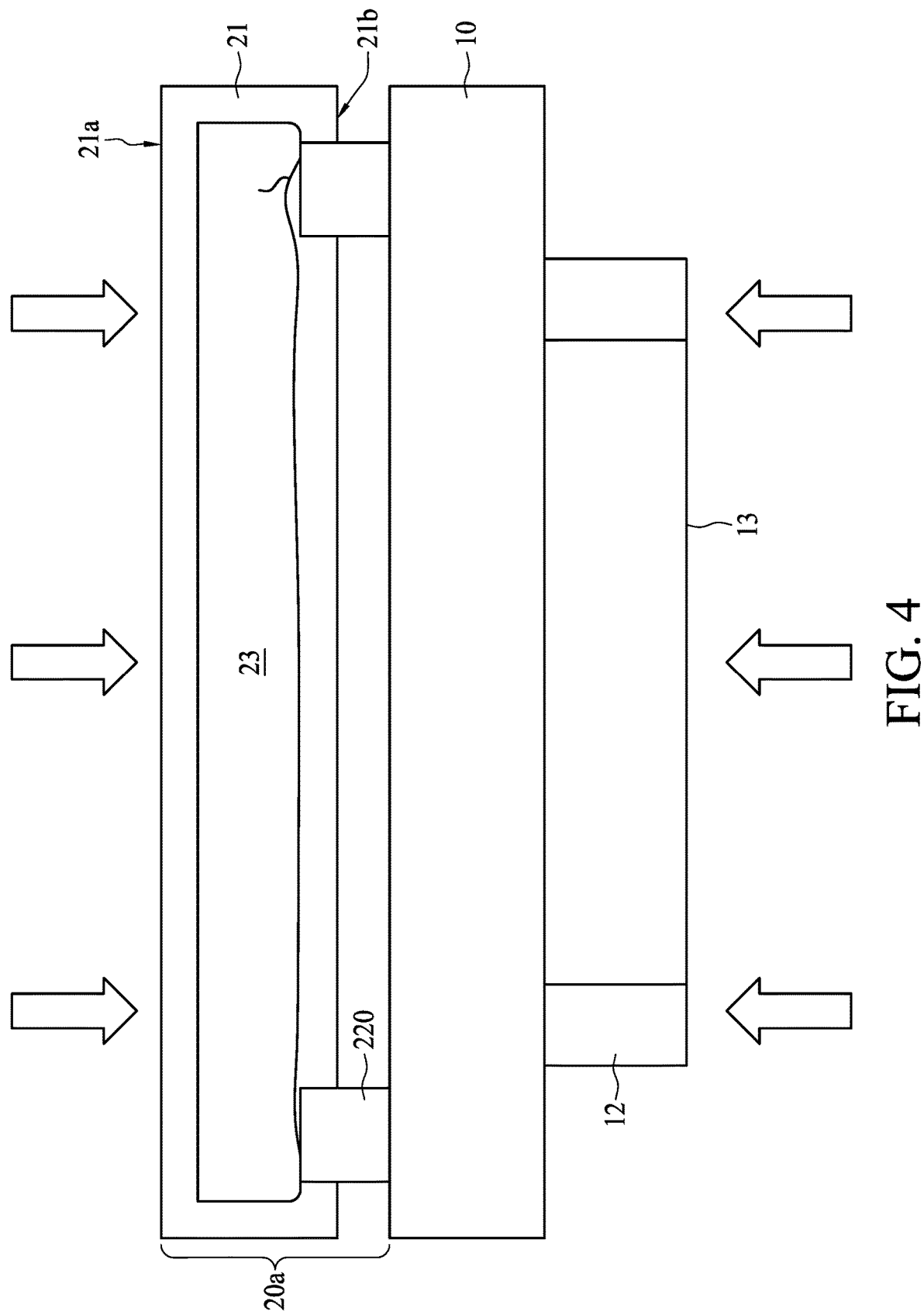

APPARATUS FOR MOUNTING A PELLICLE TO A PHOTOMASK AND METHOD FOR MOUNTING A PELLICLE TO A PHOTOMASK

BACKGROUND

In the semiconductor industry, there is a trend toward higher device density. In order to achieve such higher density, smaller features are required. Such requirements frequently involve scaling down device geometries to achieve lower fabrication costs, higher device integration density, higher speeds, and better performance. Along with the advantages from geometry size reductions, improvements to semiconductor devices are being made.

As semiconductor industry continues to evolve, advanced photolithography techniques have been widely used in integrated circuit fabrication operation. Photolithography operations may include techniques pertinent to coating a photoresist layer on a wafer and exposing the wafer to an exposing source.

Masks can be used in semiconductor fabrication operations to transfer a predetermined pattern onto a substrate. For example, after forming a photoresist layer over a substrate, the photoresist layer can be exposed to an actinic radiation through a mask, thus a photoresist pattern can be formed by subsequent development.

In order to improve the performance of lithography operations, a pellicle including a pellicle membrane can be used to alleviate the amount of particles fallen on patterns of the photomask. By keeping a distance between the particles and the pattern of the photomask, the particles may be out of focus under exposure operations, thereby alleviating printing defects contributed by the particles.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a schematic drawing illustrating a cross sectional view of a mounting plate, a pellicle and a photomask during an operation of mounting the pellicle on the photomask, in accordance with some comparative embodiments of the present disclosure.

DETAILED DESCRIPTION

Figure 1:
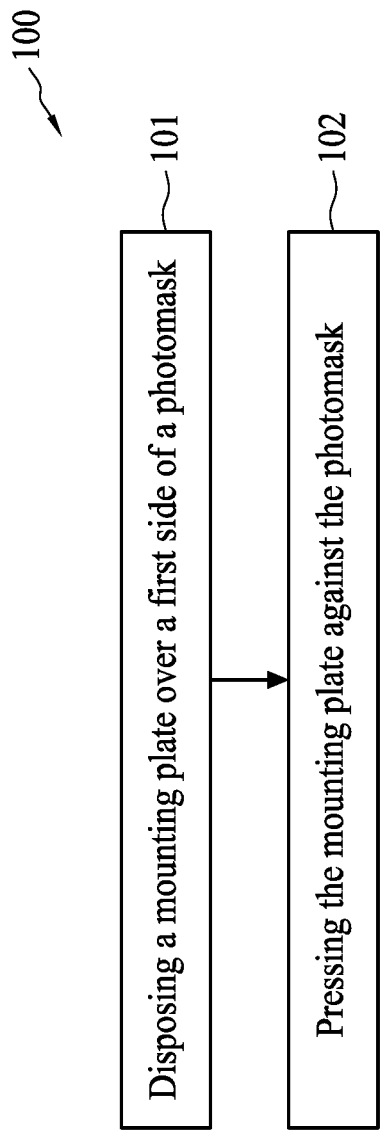
FIG. 1 shows a flow chart representing method for mounting a pellicle to a photomask, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Referring to FIG. 1, FIG. 1 shows a flow chart representing method for mounting a pellicle to a photomask, in accordance with some embodiments of the present disclosure. The method 100 for mounting a pellicle to a photomask includes disposing a mounting plate over a first side of a photomask (operation 101), and pressing the mounting plate against the photomask (operation 102).

Figure 2:
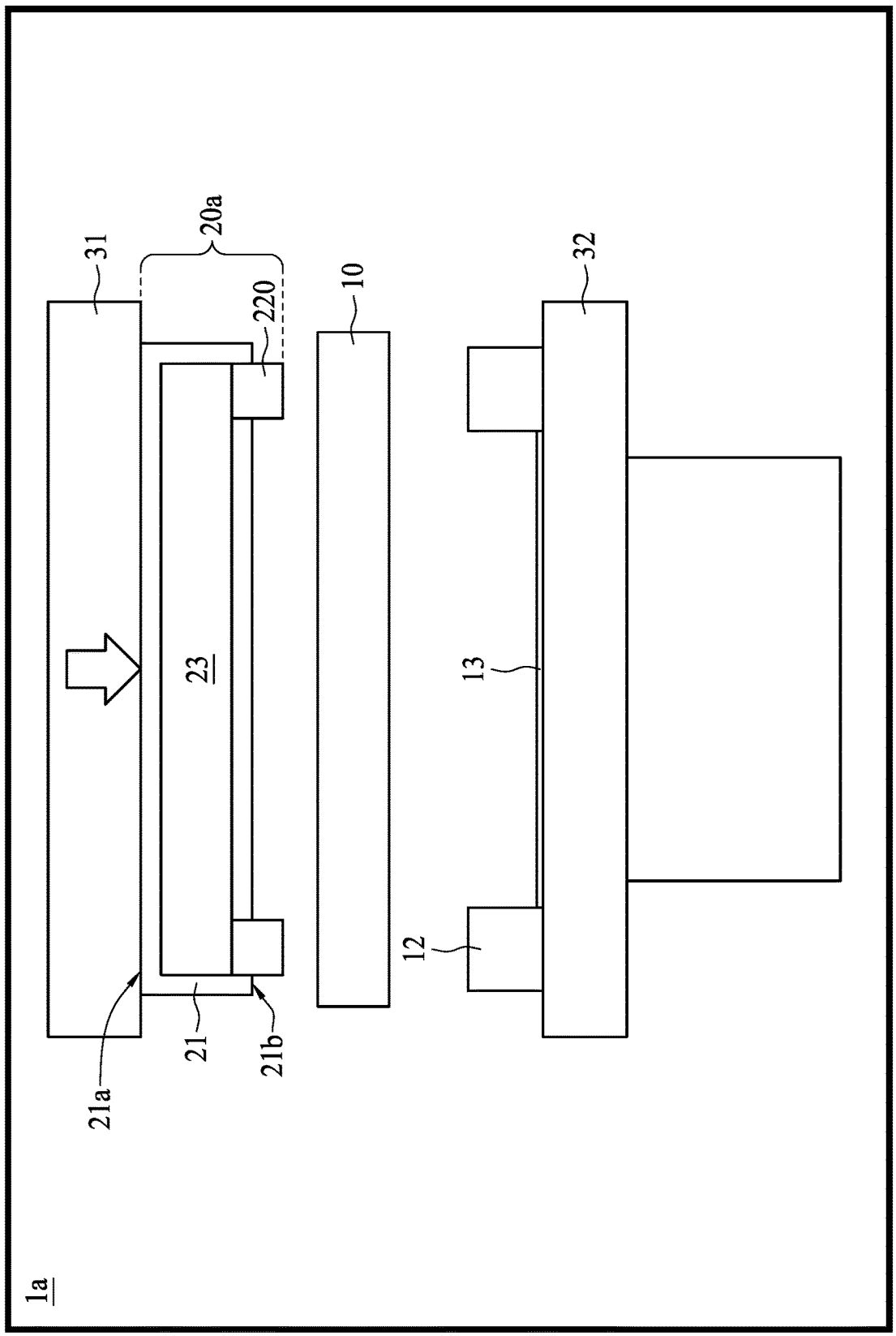
FIG. 2 is a schematic drawing illustrating an apparatus for mounting a pellicle to a photomask, in accordance with some comparative embodiments of the present disclosure.

Referring to FIG. 2, FIG. 2 is a schematic drawing illustrating an apparatus for mounting a pellicle to a photomask, in accordance with some comparative embodiments of the present disclosure. An apparatus 1a for mounting a pellicle 12 to a photomask 10 includes a mounting plate 20a and a pellicle securing stage 32. The mounting plate 20a includes a cover 21, wherein the cover 21 has a first side 21a and a second side 21b opposite to the first side 21a. The mounting plate 20a further includes a plurality of stress distributors 220 protruding from the second side 21b of the cover 21 and toward the pellicle supporting stage 32. The pellicle securing stage 32 is configured to secure a pellicle 12, which allows the pellicle 12 to be disposed between the mounting plate 20a and the pellicle supporting stage 32. The presser 31 is configured to apply stress over the cover 21, so that the presser 31 can press the mounting plate 20a against the photomask 10 and further press the photomask 10 against the pellicle 12, thereby the pellicle 12 can be mounted to the photomask 10.

Figure 3:
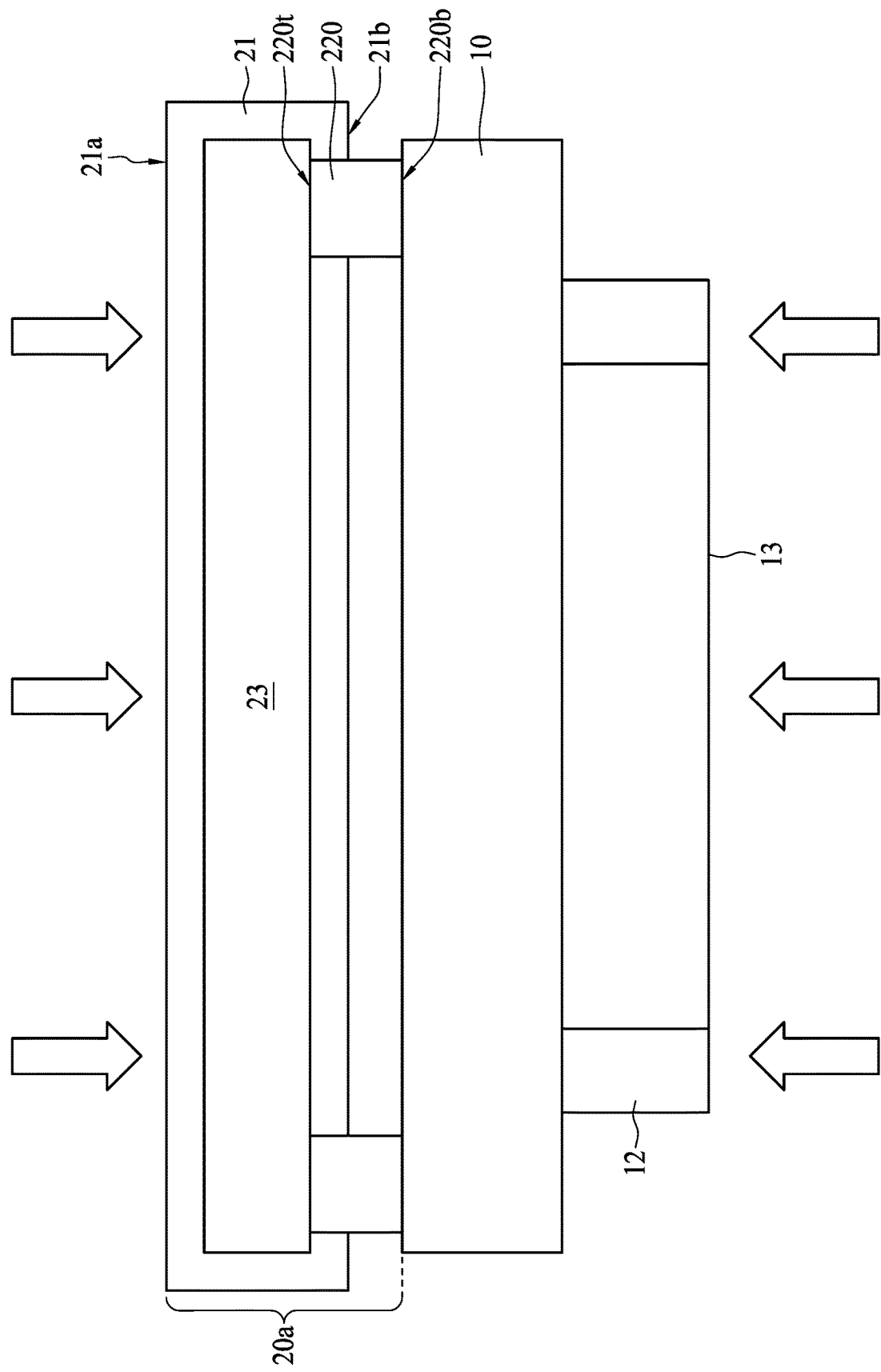
FIG. 3 is a schematic drawing illustrating a cross sectional view of a mounting plate, a pellicle and a photomask during an operation of mounting the pellicle on the photomask, in accordance with some comparative embodiments of the present disclosure.

Referring to FIG. 3, FIG. 3 is a schematic drawing illustrating a cross sectional view of a mounting plate 20a, a pellicle and a photomask during an operation of mounting the pellicle on the photomask, in accordance with some comparative embodiments of the present disclosure. In a comparative embodiment, the mounting plate 20a further include a gel layer 23 disposed inside the cover 21 to serve as a buffer layer, wherein a top end 220t of the plurality of stress distributors 220 contacts with the gel layer 23; while a bottom end 220b of the plurality of stress distributors 220 opposite to the top end 220t extends toward the pellicle securing stage 32 (as shown in FIG. 2). By the configuration of the plurality of stress distributors 220, when a presser presses the photomask 10 against the pellicle 12, the plurality of stress distributors 220 pressed by the gel layer 23 distributes the stress toward various locations on the photomask 10. It should be noted that in order to avoid pressing the photomask 10 against the pellicle 12 with excessive pressure applied by the pellicle 12 (which may include harder materials, such as metal), the gel layer 23 can serve as a buffer layer with certain extent of flexibility to buffer the force applied thereon.

Referring to FIG. 4, FIG. 4 is a schematic drawing illustrating a cross sectional view of a mounting plate 20a, a pellicle and a photomask during an operation of mounting the pellicle on the photomask, in accordance with some comparative embodiments of the present disclosure. However, after performing a plurality of mounting operations, the gel layer 23 is prone to be damaged due to stress concentration. Specifically, damages, cracks and/or cavities may be induced on (or adjacent to) a surface of the gel layer 23 contacting with some of the stress distributors 220, and the damages, cracks and/or cavities may decrease the flexibility of the gel layer 23. Thus the gel layer 23 may not be able to effectively buffer the force applied thereon due to loss of flexibility. In some embodiments, a bottom surface of the gel layer 23 and a top surface of each of the stress distributor 220 may be misaligned after cycles disposing the mounting plate 20a over the photomask 10. Furthermore, since a bottom surface of the gel layer may be non-uniform, some of the plurality of stress distributors 220 may not be able to distribute pressing stress since such stress distributors may not be able to stay contact with both the gel layer 23 and the photomask 10.

Figure 5A:
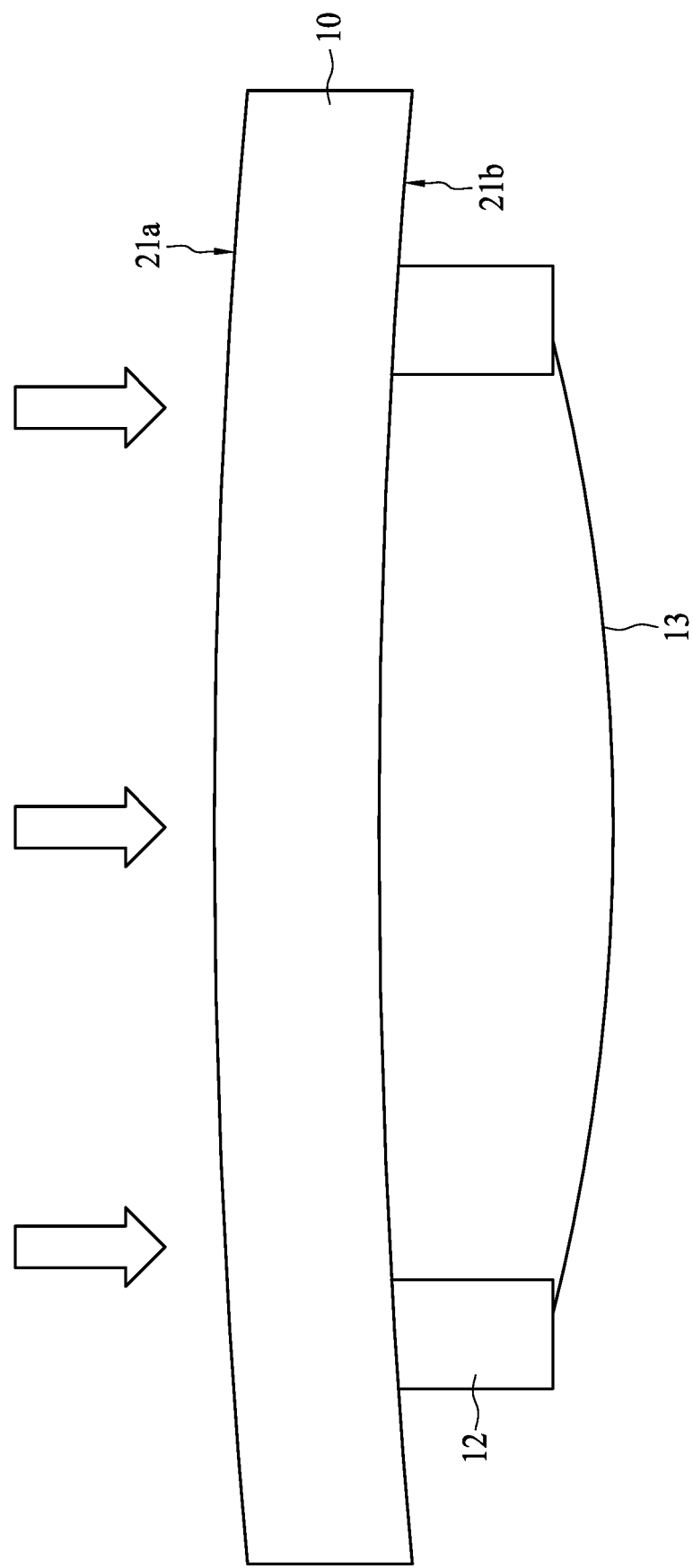
FIG. 5A is a schematic drawing illustrating a cross sectional view of a photomask and a pellicle after an operation of mounting the pellicle on the photomask, in accordance with some comparative embodiments of the present disclosure.
Figure 5B:
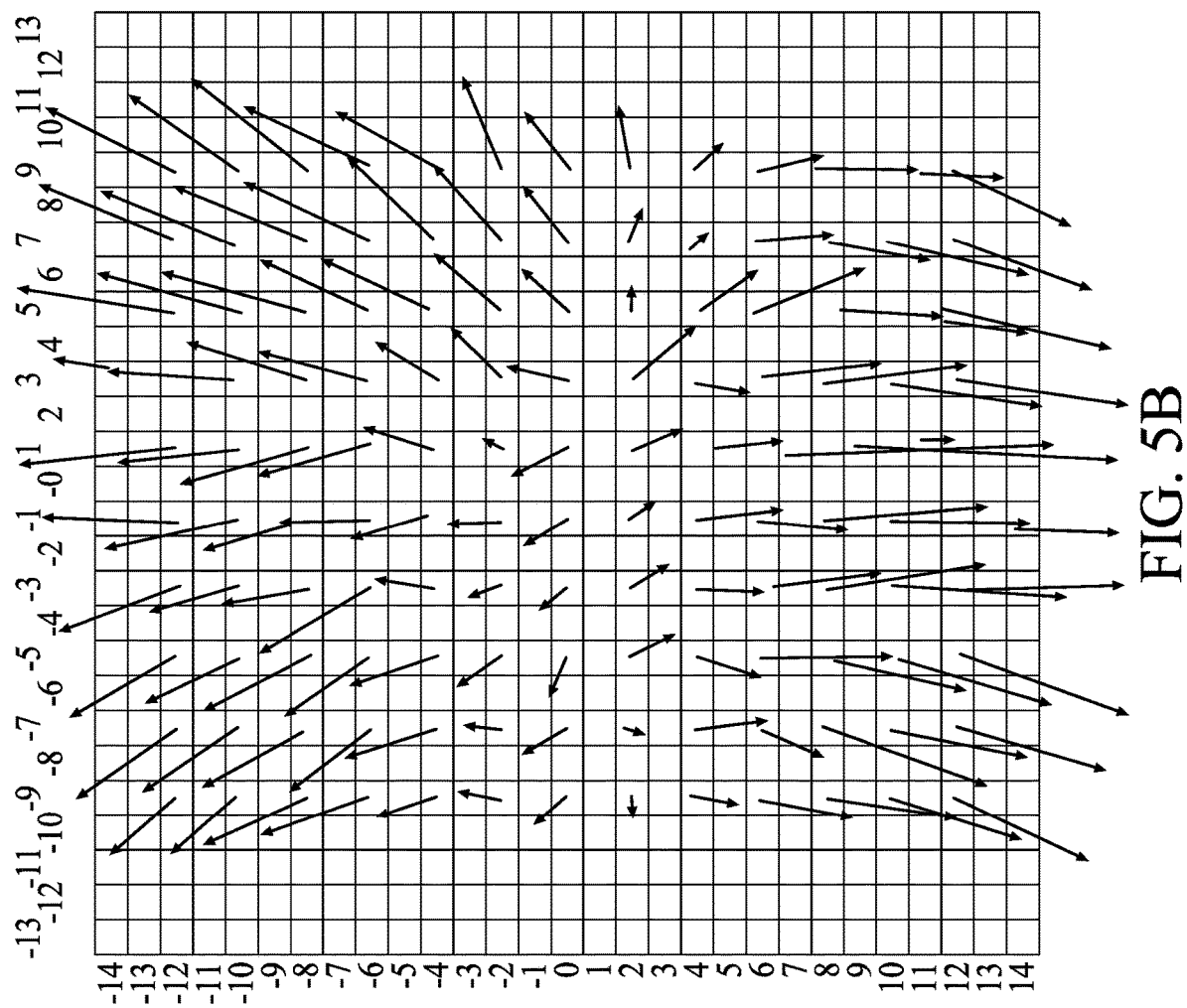
FIG. 5B is a diagram illustrating deformation of the photomask induced after an operation of mounting the pellicle on the photomask, in accordance with some comparative embodiments of the present disclosure.

Referring to FIG. 5A and FIG. 5B, FIG. 5A is a schematic drawing illustrating a cross sectional view of a photomask and a pellicle after an operation of mounting the pellicle on the photomask, and FIG. 5B is a diagram illustrating deformation of the photomask induced after an operation of mounting the pellicle on the photomask, in accordance with some comparative embodiments of the present disclosure. Due to the phenomena discussed in FIG. 4, the stress is not uniformly distributed in the photomask 10, and the stress may be specifically concentrated on stress distributors 220 which may have a top surface contacting the damaged position of the gel layer 23. It can be observed that the photomask 10 is distorted due to the non-uniform stress applied thereon, and the pattern on the photomask 10 may also be distorted, thereby causing shifting errors during performing subsequent lithography operations. For example, a photomask 10 may be distorted and concave away from the pellicle membrane 13. The comparison between a uniform photomask 10 and a distorted photomask 10 is illustrated in the diagram of FIG. 5B. Herein a plurality of reference points is selected on the uniform photomask 10 and the arrow tails in the diagram indicates the positions of such reference points before performing a plurality of cycles of mounting operations. After a predetermined number of cycles of mounting operations, the positions of the reference points are obtained, which are illustrated as the positions of arrow heads in the diagram. Alternatively stated, lengths of the arrows shown in the diagram can be deemed as a quantification of displacement induced at each of the reference points caused by cycles of the mounting operations. In the example provided in FIG. 5A, displacements of reference points are relatively greater around a peripheral area than around a center area of the photomask 10.

In addition, users may not be able to predict when the photomask 10 would be distorted to an unacceptable extent due to the damage induced on the gel layer 23, since users may not have access to the condition to gel layer 23 until the mounting plate 20a is disassembled and the gel layer 23 is taken out and examined. Therefore, it is difficult to determine a proper timing for the gel layer 23 replacement. It is often too late to replace the mounting plate 20a or the gel layer 23 after a large number of devices fabricated by the distorted photomask 10 are found defective. Furthermore, replacing the mounting plate 20a or the gel layer 23 may cause higher cost and/or may be time-consuming.

The present disclosure provide an apparatus for mounting a pellicle to a photomask and methods for mounting a pellicle to a photomask, wherein the uniformity of applying stress onto the photomask is improved and the risk of inducing damage on buffer layer inside the cover of the mounting plate is reduced. Furthermore, the apparatus for mounting a pellicle to a photomask and methods for mounting a pellicle to a photomask provided in the present disclosure allows user to access the condition of the buffer layer inside the cover of the mounting plate easily, wherein it is more convenient to inspect if there is damage to the buffer layer on regular basis (such as on daily basis, on weekly basis, or in accordance with a predetermined schedule) without disassembling the mounting plate, and it is relatively easier to adjust the condition of the buffer layer without disassembling the mounting plate.

Figure 6A:
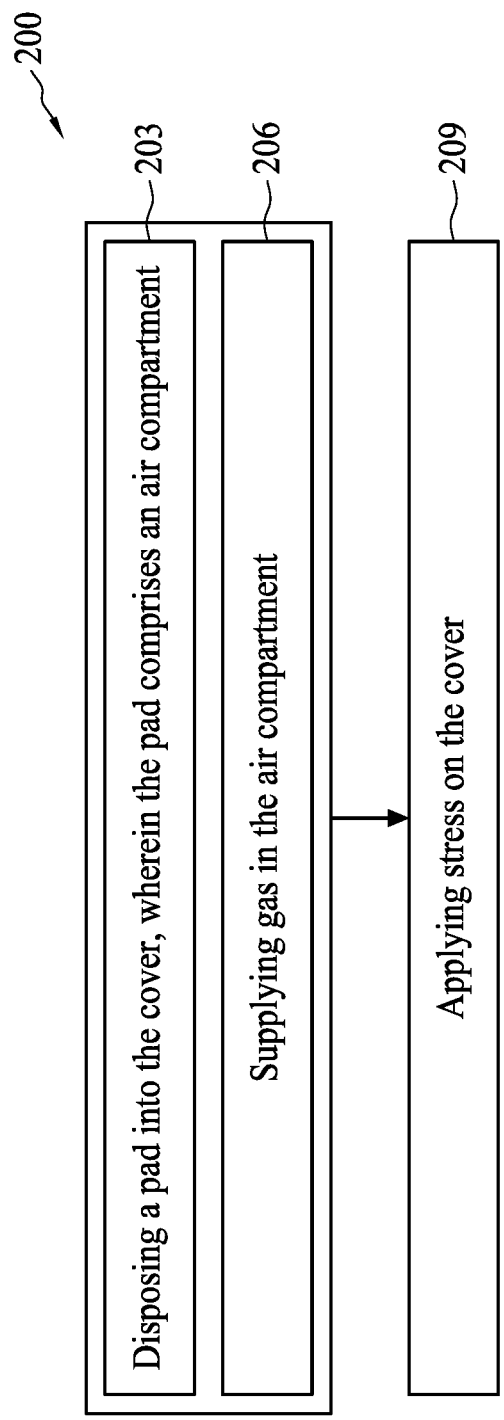
FIG. 6A shows a flow chart representing method for mounting a pellicle to a photomask, in accordance with some embodiments of the present disclosure.

Referring to FIG. 6A, FIG. 6A shows a flow chart representing method for mounting a pellicle to a photomask, in accordance with some embodiments of the present disclosure. The method 200 for mounting a pellicle to a photomask includes disposing a pad into the cover, wherein the pad comprises an air compartment (operation 203), supplying gas in the air compartment (operation 206), and applying stress on the cover (operation 209).

Figure 6B:
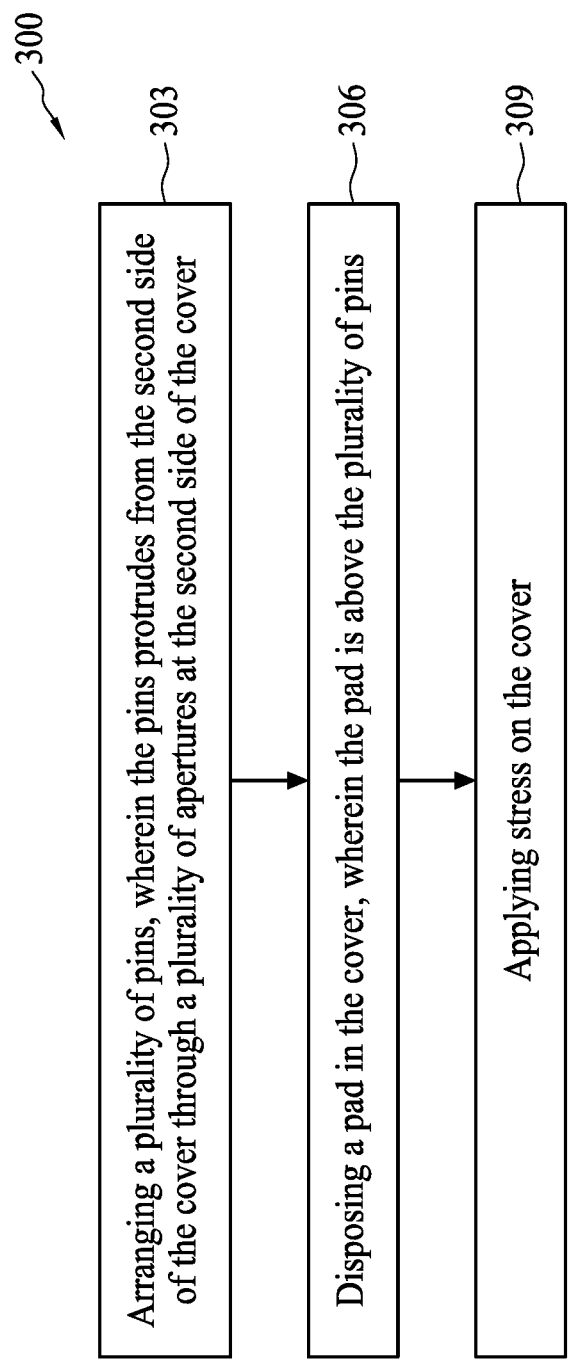
FIG. 6B shows a flow chart representing method for mounting a pellicle to a photomask, in accordance with some embodiments of the present disclosure.

Referring to FIG. 6B, FIG. 6B shows a flow chart representing method for mounting a pellicle to a photomask, in accordance with some embodiments of the present disclosure. The method 300 for mounting a pellicle to a photomask includes arranging a plurality of pins, wherein the pins protrudes from the second side of the cover through a plurality of apertures at the second side of the cover (operation 303), disposing a pad in the cover, wherein the pad is above the plurality of pins (operation 306), and applying stress on the cover (operation 309).

Figure 7:
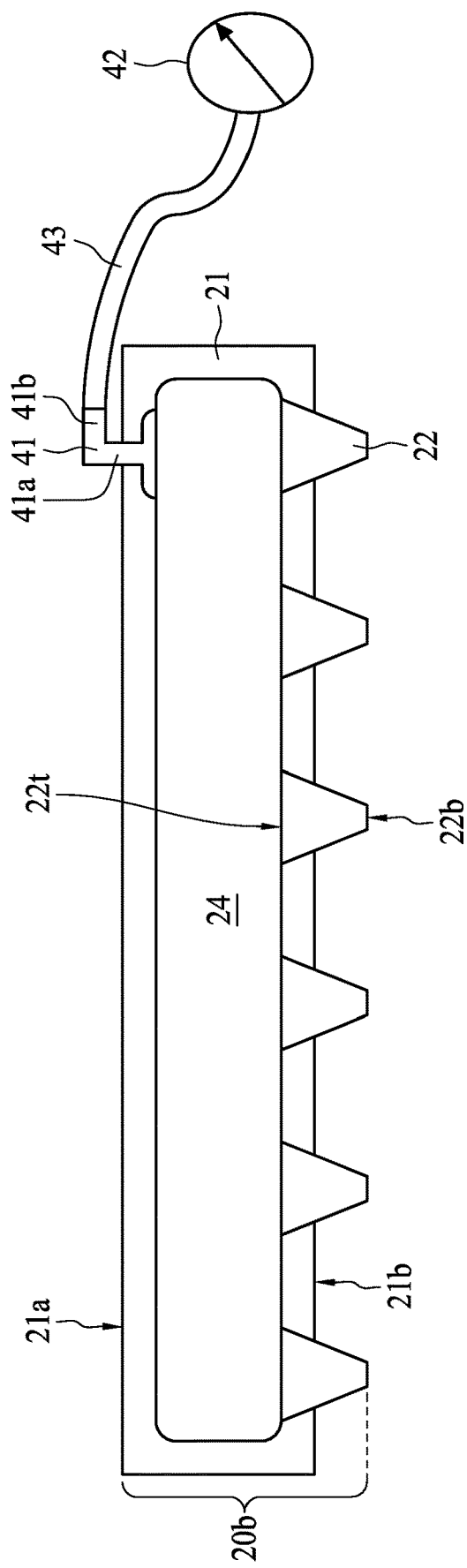
FIG. 7 is a schematic drawing illustrating a cross sectional view of a mounting plate, in accordance with some embodiments of the present disclosure.
Figure 8:
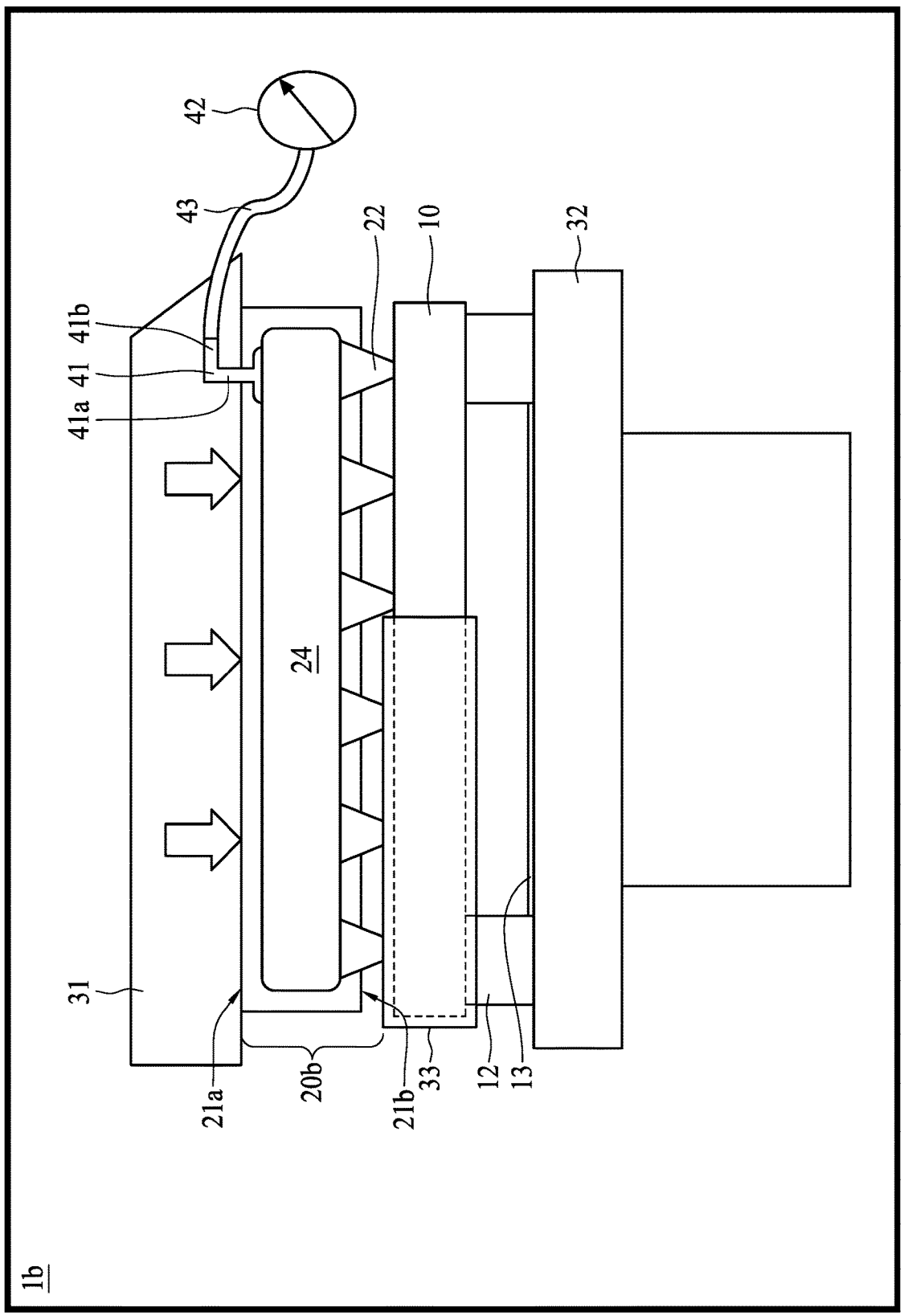
FIG. 8 is a schematic drawing illustrating an apparatus for mounting a pellicle to a photomask, in accordance with some embodiments of the present disclosure.

Referring to FIG. 7 and FIG. 8, FIG. 7 is a schematic drawing illustrating a cross sectional view of a mounting plate and FIG. 8 is a schematic drawing illustrating an apparatus for mounting a pellicle to a photomask, in accordance with some embodiments of the present disclosure. An apparatus 1b for mounting a pellicle 12 to a photomask 10 includes a presser 31, a mounting plate 20b and a pellicle securing stage 32. The mounting plate 20b includes a cover 21, wherein the cover 21 has a first side 21a and a second side 21b opposite to the first side 21a. The mounting plate 20b further includes a plurality of pins 22 protruding from the second side 21b of the cover 21 and toward the pellicle supporting stage 32. Herein the pins may be stress distributors. The first side 21a of the cover 21 faces the presser 31, wherein the first side 21a of the cover 21 contacts with the presser 31 during the operation of mounting the pellicle 12 to the photomask 10. The pellicle securing stage 32 is configured to secure a pellicle 12, which allows the pellicle 12 to be disposed between the mounting plate 20b and the pellicle supporting stage 32. The apparatus 1b may further include a photomask securer 33 between the mounting plate 20b and the pellicle securing stage 32, wherein the photomask securer 33 secures a photomask 10 to be disposed between the mounting plate 20b and the pellicle 12. Alternatively stated, the photomask 10 is disposed on the other side of the cover 21 with regard to the presser 31, wherein the second side 21b of the cover 21 faces the photomask 10.

The presser 31 is configured to apply stress over the first side 21a of the cover 21, so that the presser 31 can press the mounting plate 20b against the photomask 10 and further press the photomask 10 against the pellicle 12, thereby the pellicle 12 is mounted to the photomask 10 (Which can be referred method 100 in FIG. 1). In some embodiments, the presser 31 and the photomask securer 33 are movable, and the pellicle securing stage 32 may be fixed so that the pellicle 12 can be stably supported by the pellicle securing stage 32. In some other embodiments, the presser 31, the photomask securer 33, and the pellicle securing stage 32 are movable, wherein the photomask securer 33 and the pellicle securing stage 32 presses against each other. The pellicle 12 includes a pellicle membrane 13, wherein a distance is spacing between the photomask 10 and the pellicle membrane 13.

The mounting plate 20b at least includes the cover 21 and an air pad 24 disposed inside the cover 21. The mounting plate 20b may include a gas inlet 41 and a plurality of pins 22, wherein the gas inlet 41 penetrates the first side 21a of the cover 21, and the plurality of pins 22 protruding from the second side 21b of the cover 21 and toward the pellicle supporting stage 32. In some embodiments, the apparatus 1b may further include a pressure gauge 42 and a gas pipe 43, wherein the pressure gauge 42 can be connected to the gas inlet 41 through the gas pipe 43. The details of the gas inlet 41, the pressure gauge 42 and the gas pipe 43 will be discussed subsequently.

It should be noted that the orientation of the apparatus 1b is not limited. In some embodiments, the presser 31 presses the photomask 10 against the pellicle 12 in a direction substantially vertical to ground, wherein the photomask 10 and the pellicle 12 are substantially parallel to ground. In some other embodiments, the presser 31 presses the photomask 10 against the pellicle 12 in a direction substantially parallel to ground, wherein the photomask 10 and the pellicle 12 are substantially vertical to ground. In some other embodiments, the presser 31 presses the photomask 10 against the pellicle 12 in any suitable direction, and the suitable direction may be vertical to a widest surface of the photomask 10.

Figure 9:
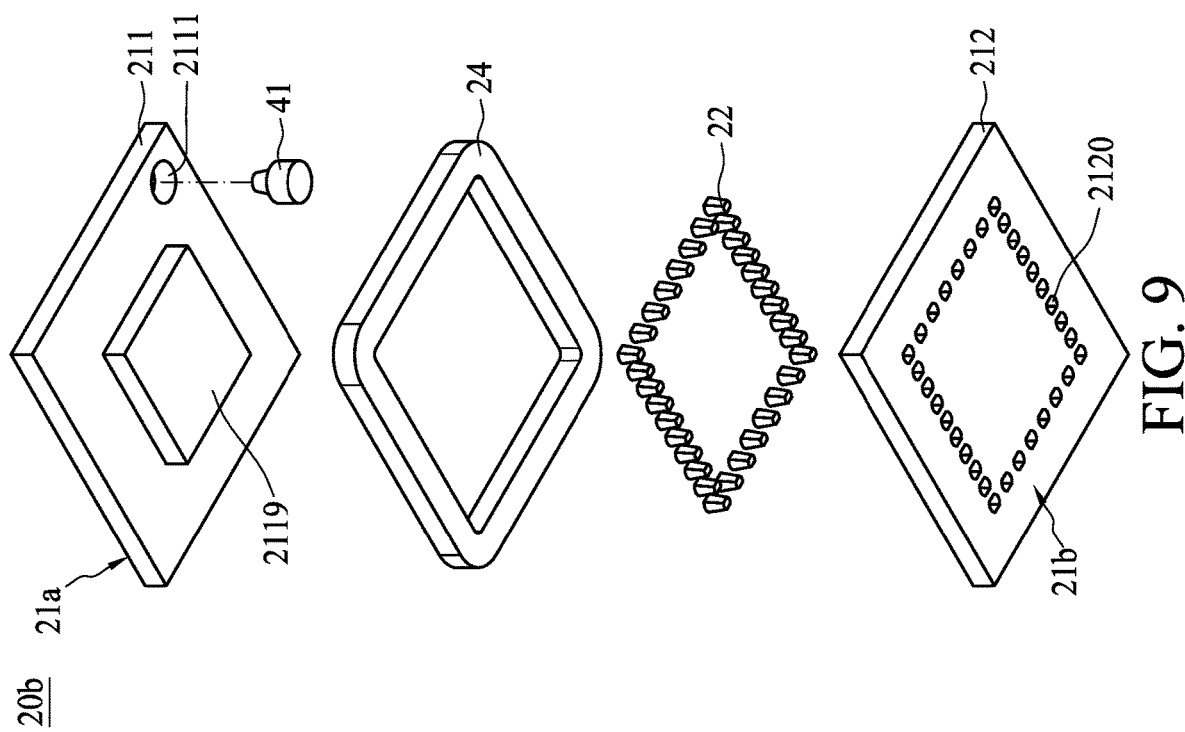
FIG. 9 is a schematic drawing illustrating an exploded view of an apparatus for mounting a pellicle to a photomask, in accordance with some embodiments of the present disclosure.
Figure 10A:
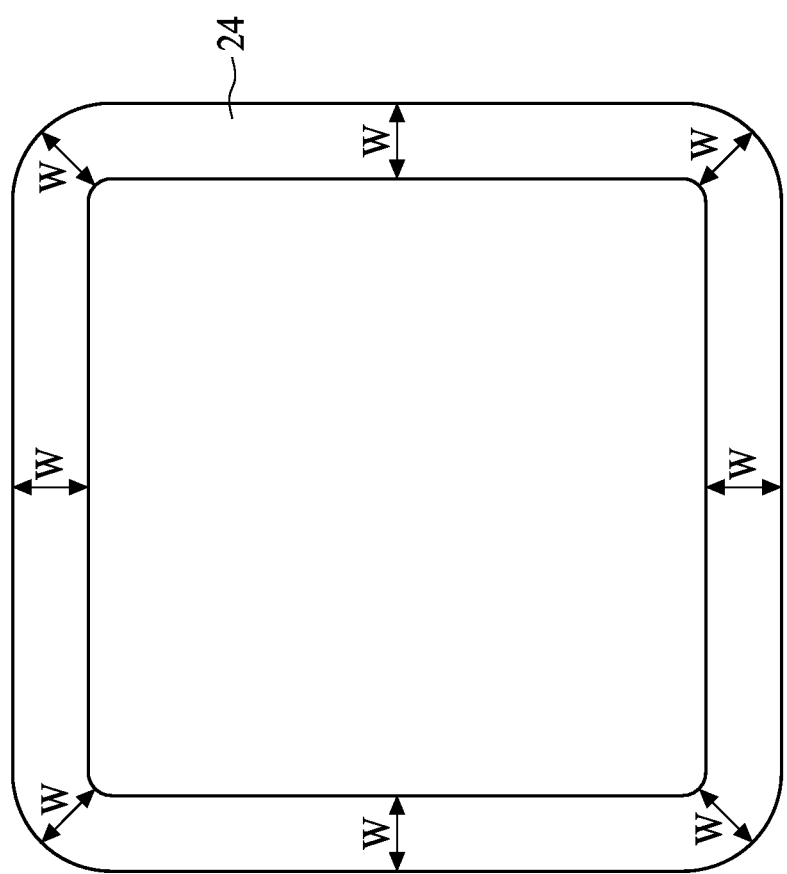
FIG. 10A is a schematic drawing illustrating a top view of a pad, in accordance with some embodiments of the present disclosure.
Figure 10B:
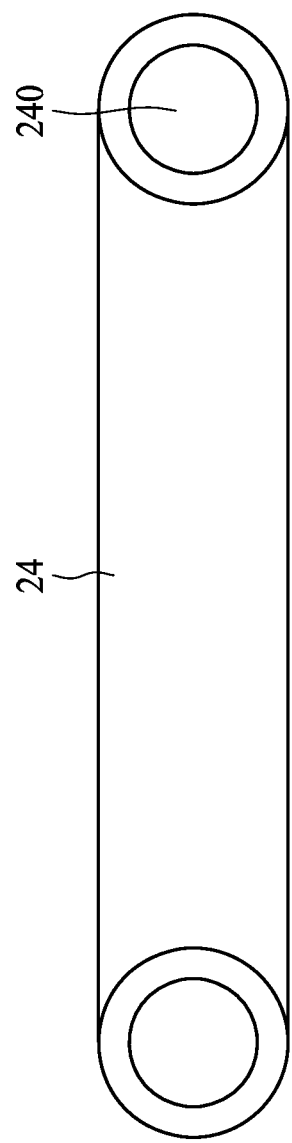
FIG. 10B is a schematic drawing illustrating a cross sectional view of a pad, in accordance with some embodiments of the present disclosure.

Referring to FIG. 8, FIG. 9, FIG. 10A, and FIG. 10B, FIG. 9 is a schematic drawing illustrating an exploded view of an apparatus for mounting a pellicle to a photomask, FIG. 10A is a schematic drawing illustrating a top view of a pad, and FIG. 10B is a schematic drawing illustrating a cross sectional view of a pad, in accordance with some embodiments of the present disclosure. In some embodiments, the cover 21 includes a first portion 211 and a second portion 212, wherein an outer surface of the first portion 211 is the first side 21a, and an outer surface of the second portion 212 is the second side 21b. The air pad 24 and the plurality of pins 22 are disposed between the first portion 211 and the second portion 212. A through hole 2111 is disposed on the first portion 211, and the gas inlet 41 penetrates through the through hole 2111. In some embodiments, the first portion 211 can be fixed to the second portion 212 through an engaging axis 2119 configured to engage with the second portion 212. In some other embodiments, the engaging axis 2119 can be substituted by any other suitable fixtures or suitable engaging mechanisms.

It should be noted that in some other embodiments, the structure of the cover 21 is not limited herein, as long as the air pad 24 can be disposed inside the cover 21. In some embodiments, the cover 21 may include three or more portions, or in some other embodiments, the cover 21 can be an integrated one-piece structure. In some other embodiments, the gas inlet 41 can be placed on any other suitable position on the cover 21, such as penetrating a side surface of the cover 21, as long as the gas inlet 21 does not substantially affect the operation of mounting.

The air pad 24 disposed between the first side 21a and the second side 21b includes an air compartment 240. The air pad 24 may be used as a buffer layer. In some embodiments, the air pad 24 is a hollowed tube, wherein an air pressure inside the air compartment 240 can be different from the air pressure outside the air compartment 240. In some embodiments, nitrogen or condensed gas may be supplied into the air compartment 240. In some embodiments, the air pad 24 can be made by plastic or other suitable polymer materials. In some embodiments, air (i.e. nitrogen or condensed gas) is supplied into the air pad 24 subsequent to disposing the air pad 24 inside the cover 21. In some other embodiments, air (i.e. nitrogen or condensed gas) is supplied into the air pad 24 prior to disposing the air pad 24 inside the cover 21.

The plurality of pins 22 are disposed between the air pad 24 and the photomask 10 in order to align the relative position of the photomask 10 and the air pad 24, and further distribute stress applied to the photomask 10. The plurality of pins 22 are disposed at the second side 21b of the cover 21 and protruding from a plurality of apertures 2120 configured on the second side 21b of the cover 21. In some embodiments, the plurality of apertures 2120 may penetrate the second portion 212. A top end 22t of the pins 22 (shown in FIG. 7) contact with the air pad 24, and a bottom end 22b of the pins 22 (shown in FIG. 7) contact with the photomask 10. In some embodiments, a width of the top end 22t of the pins 22 is greater than a width of the bottom end 22b of the pins 22, and after disposing the pins 22 into the apertures 2120, a portion of the pins is within the cover 21 and another portion of the pins is on the outside of the cover 21. The plurality of pins 22 may not be adhered to the surface of the apertures 2120 so that the air pad 24 can apply stress over photomask 10 through the plurality of pins 22. When performing a mounting operation, the presser 31 presses over the first side 21a of the cover 21, and the air pad 24 presses the plurality of pins 22 against the photomask 10. The photomask 10 is pressed against to the pellicle 12 and the pellicle 12 is thereby mounted to the photomask 10.

Figure 11:
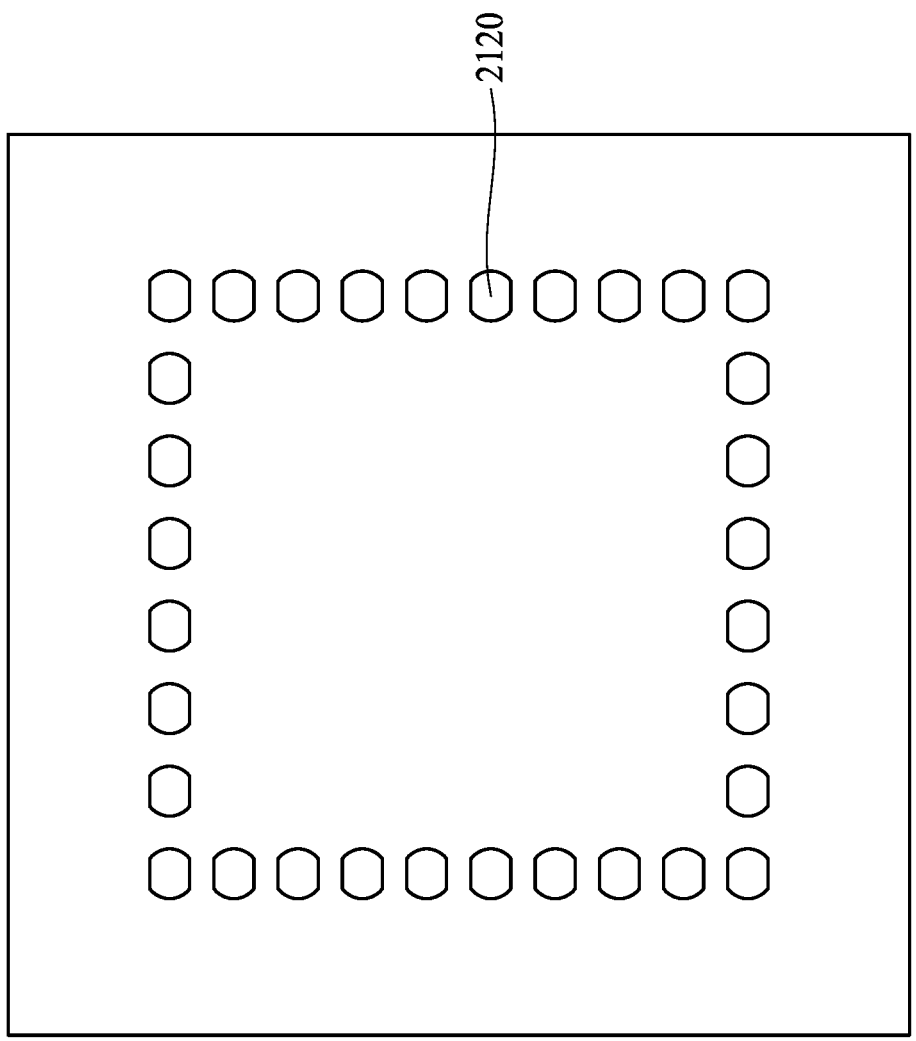
FIG. 11 is a schematic drawing illustrating a bottom view of a cover, in accordance with some embodiments of the present disclosure.

Referring to FIG. 9, FIG. 10A and FIG. 11, FIG. 11 is a schematic drawing illustrating a bottom view of a cover, in accordance with some embodiments of the present disclosure. An arrangement of the plurality of pins 22 corresponds to a shape of the air pad 24, and an arrangement of the plurality of apertures 2120 corresponds to the arrangement of the plurality of pins 22. In some embodiments, since the photomask 10 is often fabricated to have a quadrilateral shape, the air pad 24 as well as the plurality of pins 22 is arranged in a quadrangle-shape in order to distribute stress applied on the photomask 10 through each pin 22 with improved uniformity. Accordingly, the shape of the air pad 24 may be in a quadrangle toroid shape so that each position of the pins 22 is overlaid with the air pad 24. In addition, each position of the pins 22 is in accordance to one aperture 2120 so that the bottom ends 22b of the pins 22 can be exposed from the cover 21, wherein the apertures 2120 are also arranged in a quadrangle-shape manner on the second side 21b of the cover 21. Alternatively, if the photomask is fabricated to have other shapes different from a quadrilateral shape, the air pad and the pins are then arranged accordingly to the shape of the photomask.

In some embodiments, the air pad 24 has a constant width W from a top view perspective (as shown in FIG. 10A). Some of the plurality of pins 22 may not stay in contact with the air pad 24 if width of the air pad 24 varies at different positions. Stress may concentrate at the junctions where widths vary and thus departing from the goal of applying uniform stress from the air pad 24 to the plurality of pins 22. Therefore the uniformity of contact between the air pad 24 and the plurality of pins 22 is improved when the air pad 24 has a constant width W from a top view perspective, or optionally in some embodiments, when a radius (from cross sectional view) of the air pad 24 is uniform.

By aforesaid arrangement of the plurality of pins 22 and the aforesaid shape of the air pad 24, the uniformity of stress distribution applied on the photomask 10 is improved. Specifically, since the air pad 24 is filled by air, air substantially fills the air compartment 240 uniformly. In addition, changes of pressure exerted on a local position in the air compartment 240 may be balanced quickly and distributed to the surroundings on inside surface of the air compartment 240. Therefore, although the presser 31 may not uniformly press the mounting plate 20b, the air pad 24 may press the plurality of pins 22 with improved uniformity since imbalance stress concentration may be alleviated due to the uniform pressure distribution in the air compartment 240. Comparing to gel layer, the air pad 24 made by plastic or suitable polymer materials with adequate flexibility may provide an improved reliability under stress applied thereto, thus the risk of inducing damage and/or cavities can be effectively alleviated. Furthermore, even if one or more pins 22 does not contact with the air pad 22 due to misalignment, uniform pressure distribution in the air compartment 240 may alleviate the imbalance stress applied to each of the pins 22, thus decrease the risk of damaging the air pad 24 stems from stress concentration and improve the uniformity of pressing the photomask 10 against the pellicle 12.

Figure 12:
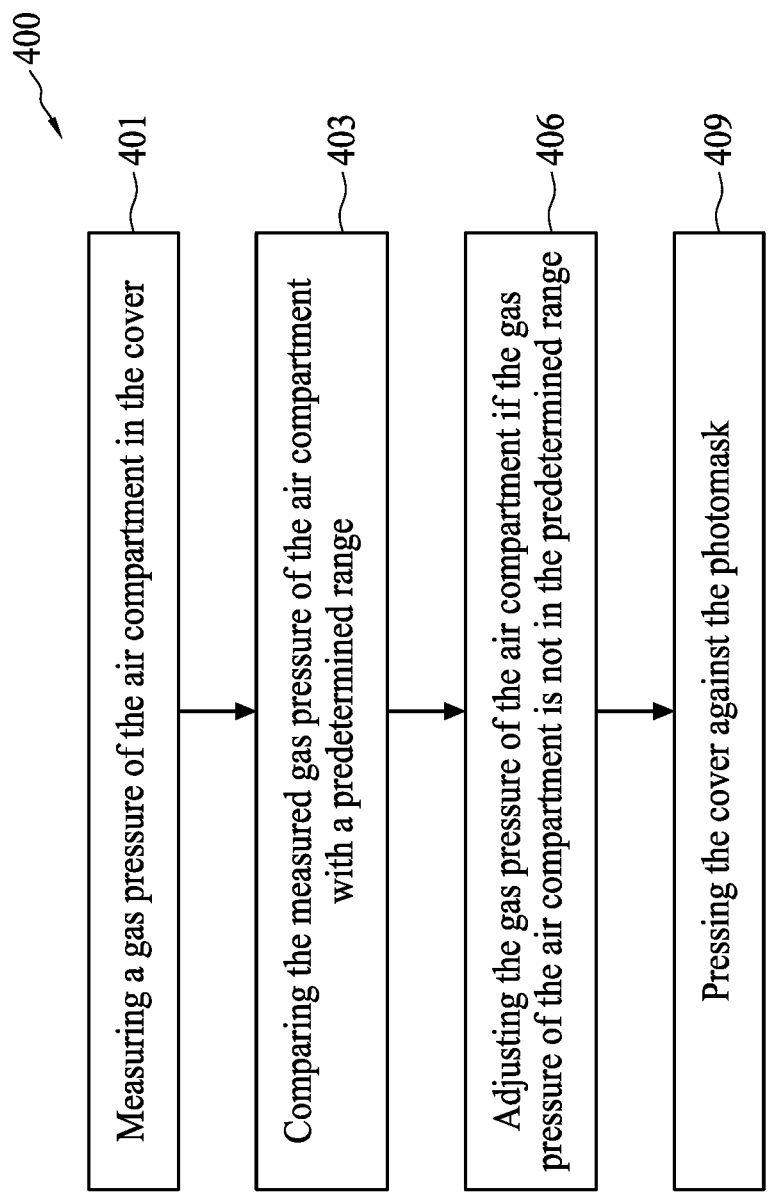
FIG. 12 shows a flow chart representing method for mounting a pellicle to a photomask, in accordance with some embodiments of the present disclosure.

Referring to FIG. 12, FIG. 12 shows a flow chart representing method for mounting a pellicle to a photomask, in accordance with some embodiments of the present disclosure. The method 400 for mounting a pellicle to a photomask includes measuring a gas pressure of the air compartment in the cover (operation 401), comparing the measured gas pressure of the air compartment with a predetermined value or a predetermined range (operation 403), adjusting the gas pressure of the air compartment if the gas pressure of the air compartment is not in the predetermined range (operation 406), and pressing the cover against the photomask (operation 409).

Referring back to FIG. 7 and FIG. 8, the gas inlet 41 is disposed on the first side 21a of the cover 21, and the gas inlet 41 is configured to allow the pressure gauge 42 to access the air compartment 240. For example, a first end 41a of the gas inlet 41 is connected to a surface of the air pad 24 proximal to the first side 21a of the cover 21, and a second end 41b of the gas inlet 41 can be connected to the pressure gauge 42 through the gas pipe 43. By accessing the air compartment 240 through the gas inlet 41, the pressure gauge 42 can measure a gas pressure in the air compartment 240. The gas pressure of the air compartment 240 can be deemed as an indication of whether the air pad 24 is damaged, leaked, deflated, or improperly inflated. In some embodiments, in order to improve the uniformity of contact between the pins 22 and the air pad 24, the gas pressure of the air compartment 240 is measured prior to pressing the cover 21 against the photomask 10, so that the gas pressure of the air compartment 240 can be adjusted to be in a predetermined range. A target gas pressure of the air compartment 240 is lower than a predetermined upper threshold value, and greater than a predetermined lower threshold value. Herein the predetermined upper threshold value and the predetermined lower threshold value are related to the shape, the size, and/or the material of the air pad 24. If the gas pressure of the air compartment 240 is greater than the predetermined upper threshold value, the pressure of air pad 24 applied on the plurality of pins 22 may be too great, or the air pad 24 may be under the risk of bursting or being damaged due to overpressure. If the gas pressure of the air compartment 240 is less than the predetermined lower threshold value, the deflation of air pad 24 may affect the contact engaging with the plurality of pins 22 or may not be able to properly distribute stress over the plurality of pins 22 against the photomask 10. In some embodiments, the gas pressure of the air compartment 240 being less than the predetermined lower threshold value may also be an indication of gas has been/is currently leaking out due to damage (such as crack or hole induced on the air pad 24). It should be noted that by filling the air pad 24 with air, even leakage is induced, the apparatus 1b, the photomask 10 or workpieces (i.e. substrate or wafer) in the apparatus 1b may not be contaminated by the filler inside the air pad 24.

In some embodiments, the measurement of the gas pressure of the air compartment 240 can be performed prior to pressing the cover 21 against the photomask 10. In some embodiments, the measurement of the gas pressure of the air compartment 240 can be performed on a predetermined schedule. In some embodiments, the measurement can be performed by a predetermined frequency, such as on daily basis or on weekly basis. In some embodiments, the measurement prior to mounting the pellicle 12 to the photomask 10. In some embodiments, the measurement subsequent to a predetermined cycles of mounting the pellicle 12 to the photomask 10. In some other embodiments, the measurement can be performed during the operation of mounting the pellicle 12 to the photomask 10. In some other embodiments, the measurement can be constantly performed to inspect the gas pressure of the air compartment 240 instantly.

Figure 13:
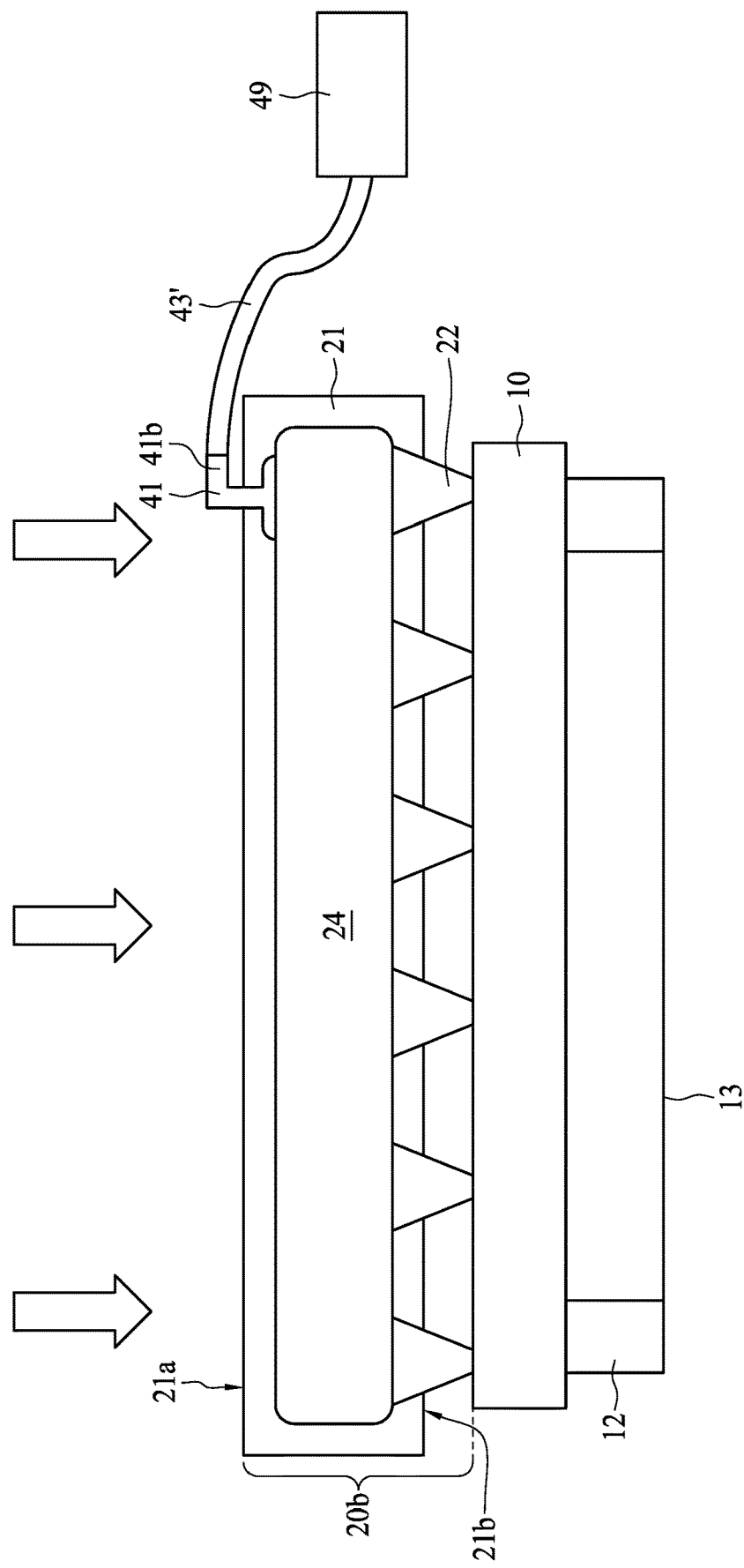
FIG. 13 is a schematic drawing illustrating an apparatus for mounting a pellicle to a photomask, in accordance with some embodiments of the present disclosure.

Referring to FIG. 13, FIG. 13 is a schematic drawing illustrating an apparatus for mounting a pellicle to a photomask, in accordance with some embodiments of the present disclosure. As previously discussed in FIG. 12, the gas pressure of the air compartment 240 is adjusted to be in the predetermined range subsequent to measuring the gas pressure of the air compartment 240. If a measured gas pressure of the air compartment 240 is greater than the predetermined upper threshold value, the gas pressure of the air compartment 240 is adjusted to be less than the predetermined upper threshold value. If a measured gas pressure of the air compartment 240 is less than the predetermined lower threshold value, the gas pressure of the air compartment 240 is adjusted to be greater than the predetermined lower threshold value. For exemplary demonstration, the predetermined upper threshold value is set to be about 2.0 Bar, and the predetermined lower threshold value is set to be at least 0.0 Bar. However, the predetermined upper threshold value and the predetermined lower threshold value may be adjusted based on one or more properties of the air pad 24.

In order to adjust the gas pressure of the air compartment 240 conveniently (for example, not required to disassemble the cover 21 in some embodiments), the second end 41b of the gas inlet 41 is connected to a gas presser adjuster 49 through a gas pipe 43', wherein the gas presser adjuster 49 may include an gas supply source (which may provide gas, such as nitrogen or condensed gas). In some embodiments, the gas presser adjuster 49 may provide pressure relief configured to exhaust air in the air compartment 240. In some other embodiments, the air in the air compartment 240 can be released into ambient environment through the gas inlet 41 or the gas pipe 43'.

Subsequent to adjusting the gas pressure of the air compartment 240, the presser 31 presses the mounting plate 20b, and the mounting plate 20 further presses the photomask 10 against the pellicle 12. Thereby the pellicle 12 is mounted on the photomask 10.

Figure 14:
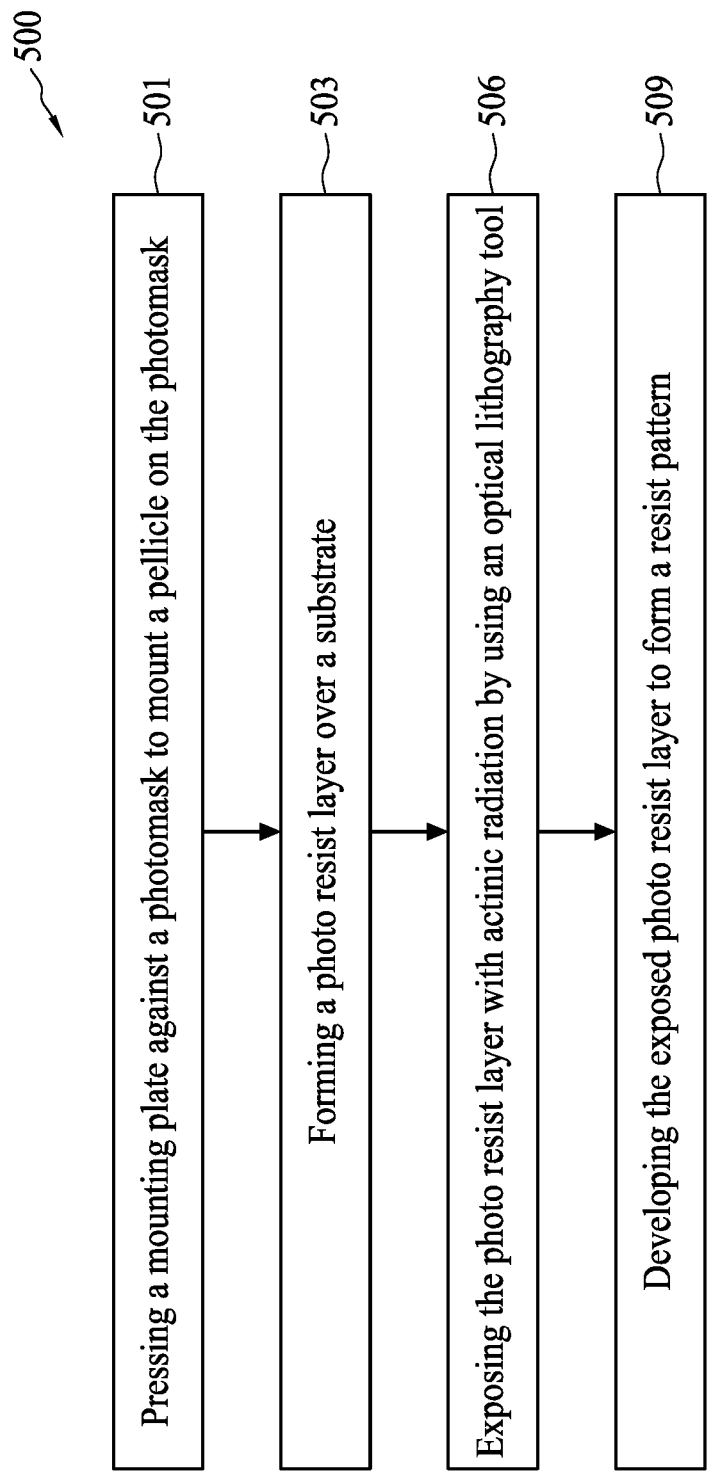
FIG. 14 shows a flow chart representing method for mounting a pellicle to a photomask, in accordance with some embodiments of the present disclosure.

Referring to FIG. 14, FIG. 14 shows a flow chart representing method for mounting a pellicle to a photomask, in accordance with some embodiments of the present disclosure. The method 500 for mounting a pellicle to a photomask includes pressing a mounting plate against a photomask to mount a pellicle on the photomask (operation 501), forming a photo resist layer over a substrate (operation 503), exposing the photo resist layer with actinic radiation by using an optical lithography tool (operation 506), and developing the exposed photo resist layer to form a resist pattern (operation 509).

Figure 15A:
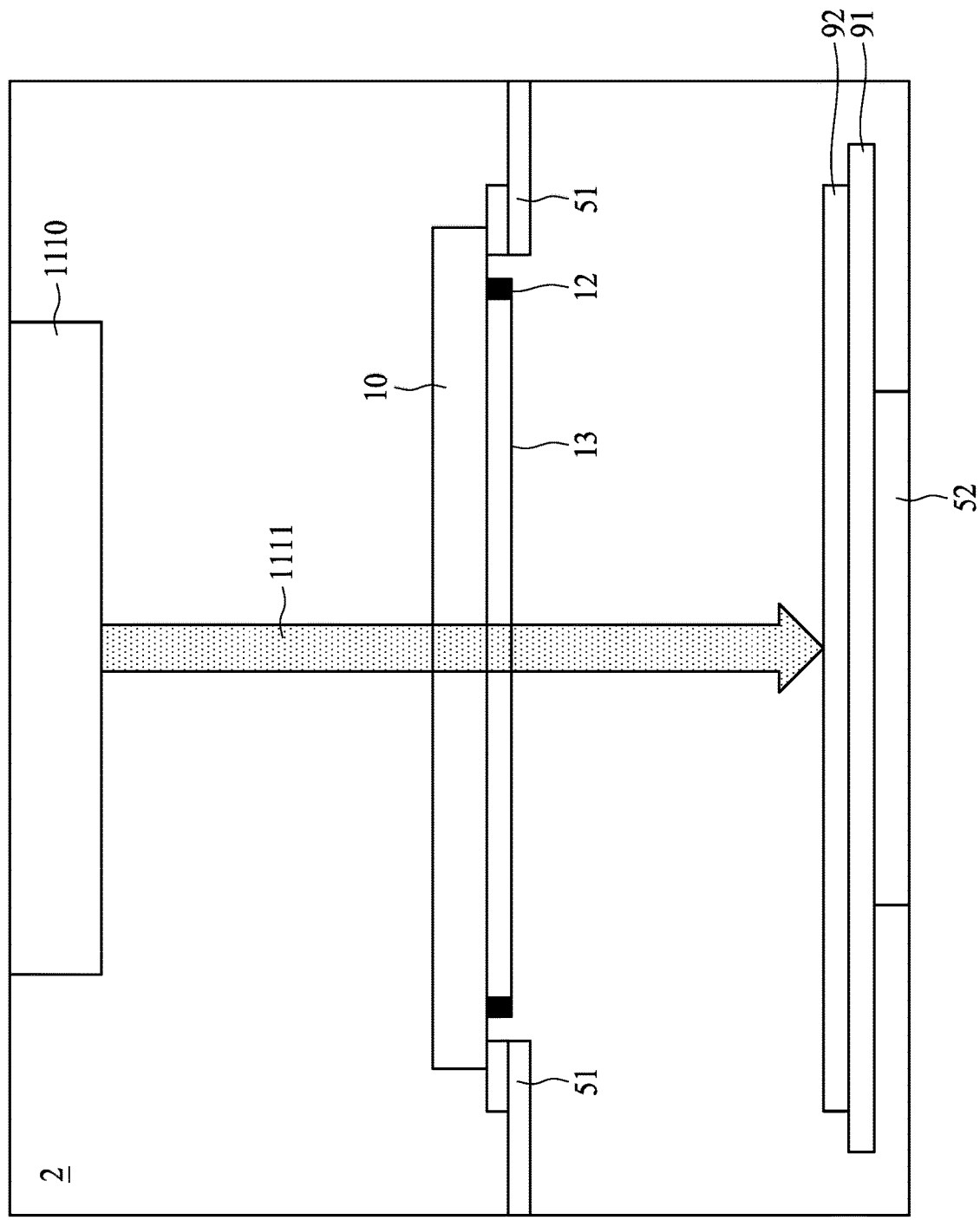
FIG. 15A is a schematic drawing illustrating a lithography apparatus, in accordance with some embodiments of the present disclosure.
Figure 15B:
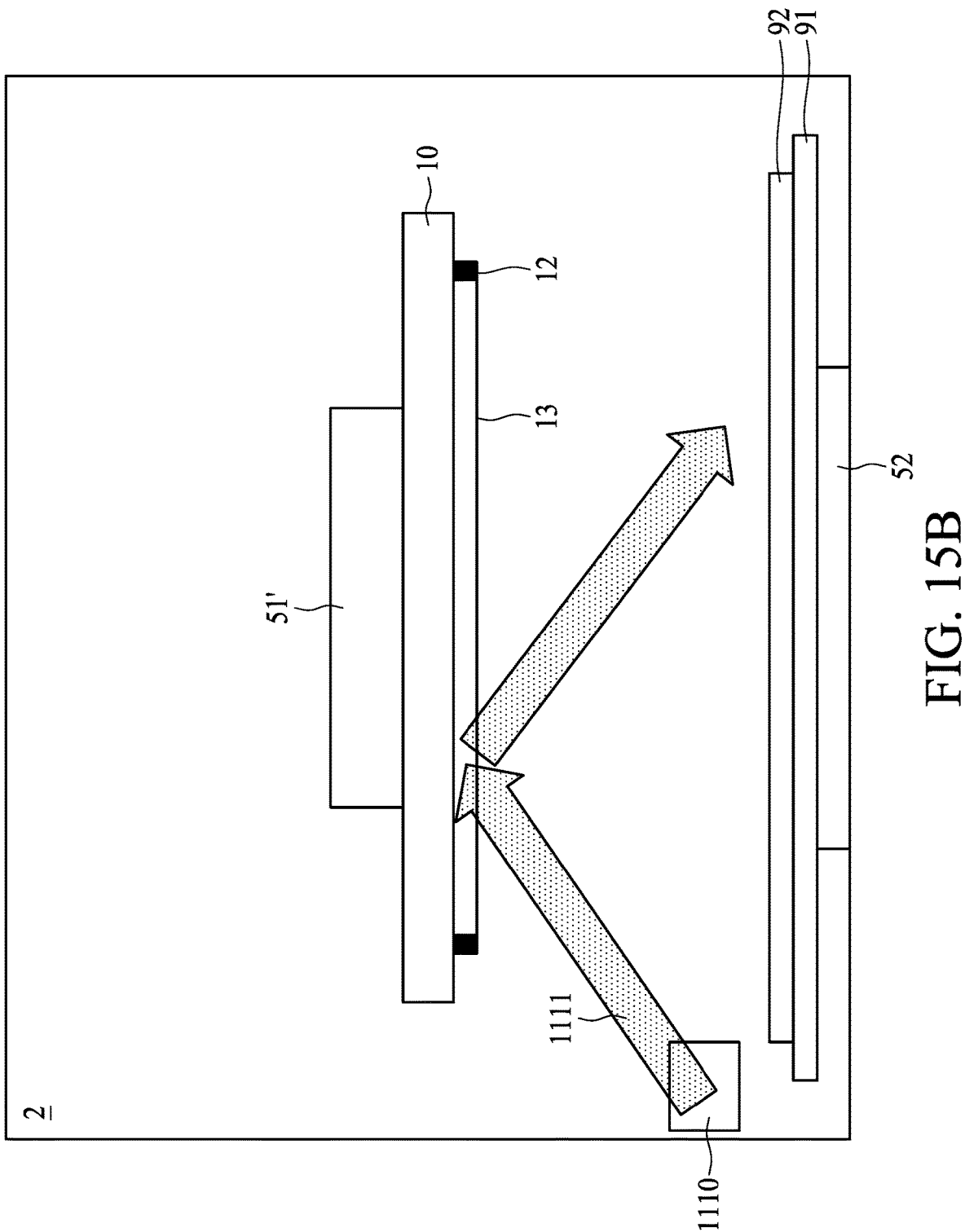
FIG. 15B is a schematic drawing illustrating a lithography apparatus, in accordance with some embodiments of the present disclosure.

Referring to FIG. 15A and FIG. 15B, FIG. 15A is a schematic drawing illustrating a lithography apparatus, FIG. 15B is a schematic drawing illustrating a lithography apparatus, in accordance with some embodiments of the present disclosure. The pellicle 12 is mounted to the photomask 10 by methods previously discussed in FIG. 6A to FIG. 13. The actinic radiation source 1110 is configured to radiate an actinic radiation 1111, wherein the actinic radiation 1111 may include extreme ultraviolet (EUV), krypton fluoride (KrF) laser, argon fluoride (ArF) laser, deep ultraviolet (DUV), or other suitable light utilized in photolithography fabrication. In some embodiments, a mask stage 51 inside a photolithography processing chamber 2 may be configured to accommodate the photomask 10 (as discussed in FIG. 6A to FIG. 13) under an actinic radiation source 1110. The actinic radiation 1111 passes through the photomask 10 and the pellicle 12 mounted on the photomask 10 (as shown in FIG. 15A). In some other embodiments, the actinic radiation 1111 passes through the pellicle and reflected by the photomask 10, wherein the photomask may be secured by a chuck 51' (as shown in FIG. 15B). A substrate 91 with a photoresist layer 92 formed above the substrate 91 is accommodated under the photomask 10 by a substrate supporter 52, so that the photoresist layer 92 can be irradiated by the actinic radiation 1111 through the photomask 10 (as shown in FIG. 15A) or reflected from the photomask 10 (as shown in FIG. 15B) in order to form a predetermined pattern. In some embodiments, one or more optical devices, such as lenses, reflection mirrors, beam splitters, beam expanders, polarizers, or wave plates, can be disposed on a path of the actinic radiation 1111 from the actinic radiation source 1110 to the photoresist layer 92 to alter a property of the actinic radiation 1111. For example, one or more lens can be used to adjust the focus of the actinic radiation source 1110.

The present disclosure provide an apparatus 1b for mounting a pellicle 12 to a photomask 10 and methods for mounting a pellicle 12 to a photomask 10, wherein the uniformity of applying stress onto the photomask 10 is improved and the risk of inducing damage on the air pad 24 inside the cover 21 of the mounting plate is reduced. In addition, by the configuration of the plurality of pins 22 and the air pad 24 as discussed in FIG. 7 to FIG. 11, the uniformity of stress distribution under pressing operation can be improved.

Furthermore, the apparatus for mounting a pellicle to a photomask and methods for mounting a pellicle to a photomask provided in the present disclosure allows the access to obtain the gas pressure of the air compartment 240 of the air pad 24 inside the cover 21 without disassembling the mounting plate, and it is relatively easier to adjust the gas pressure of the air compartment 240 of the air pad 24 without disassembling the mounting plate. When the gas pressure of the air compartment 240 is out of a predetermined range, the gas pressure of the air compartment 240 is adjusted before fabricating photomask 10, thus can alleviate the risk of producing massive amount of defective semiconductor devices with distorted photomask due to the unknown and undesired condition of the mounting plate used in the fabrication of the photomask 10.

Some embodiments of the present disclosure provide an apparatus for mounting a pellicle to a photomask, including a cover having a first side and a second side opposite to the first side, wherein the second side is configured to face the photomask, and an air pad disposed between the first side and the second side, wherein the air pad comprises a compartment filled with air.

Some embodiments of the present disclosure provide an apparatus for mounting a pellicle to a photomask, including a cover having a first side and a second side opposite to the first side, wherein the second side is configured to face photomask, and a gas inlet on the first side of the cover.

Some embodiments of the present disclosure provide a method for mounting a pellicle to a photomask, including disposing a pad into a cover having a first side and a second side opposite to the first side, wherein the pad comprises an air compartment, supplying gas into the air compartment, and applying stress on the cover.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus for mounting a pellicle to a photomask, comprising:
    a cover having a first side and a second side opposite to the first side, wherein the second side is configured to face the photomask; and
    an air pad made of a flexible material disposed between the first side and the second side, wherein the air pad comprises a compartment filled with air.

2. The apparatus of claim 1, further comprising a plurality of pins disposed between the air pad and the photomask.

3. The apparatus of claim 2, wherein the plurality of pins protrude from the second side through a plurality of apertures at the second side of the cover.

4. The apparatus of claim 3, wherein an arrangement of the plurality of apertures corresponds to a shape of the air pad.

5. The apparatus of claim 2, wherein the plurality of pins are arranged in a quadrangle-shape.

6. The apparatus of claim 1, further comprising a gas inlet penetrating the first side of the cover.

7. The apparatus of claim 1, further comprising a presser over the first side of the cover, wherein the presser is configured to apply stress over the first side of the cover.

8. An apparatus for mounting a pellicle to a photomask, comprising:
    a cover having a first side and a second side opposite to the first side, wherein the second side is configured to face the photomask, and a plurality of apertures are configured to penetrate the second side of the cover;
    a gas inlet on the first side of the cover; and
    a plurality of pins, each of the pins is placed in the aperture and has a top width at a top end, the top width is greater than a width of the aperture.

9. The apparatus of claim 8, further comprising an air pad disposed between the first side and the second side of the cover, wherein the air pad comprises an air compartment.

10. The apparatus of claim 9, wherein the air compartment of the air pad is filled with at least one of the nitrogen gas and condensed gas.

11. The apparatus of claim 9, wherein the air pad has a constant width from a top view perspective.

12. The apparatus of claim 9, wherein the gas inlet is configured to allow a pressure gauge to access the air compartment.

13. The apparatus of claim 9, wherein each of the plurality of pins has a bottom width at a bottom end opposite to the top end, the bottom width is less than a width of the aperture.

14. A method for mounting a pellicle to a photomask, comprising:
    disposing a flexible material in a cover, wherein the cover has a first side and a second side opposite to the first side;
    supplying gas into an air compartment surrounded by the flexible material; and
    applying stress on the cover.

15. The method of claim 14, further comprising pressing the cover against the photomask.

16. The method of claim 15, wherein pressing the cover against the photomask comprises pressing a plurality of pins protruding from the second side of the cover against the photomask.

17. The method of claim 15, further comprising measuring a gas pressure of the air compartment prior to pressing the cover against the photomask.

18. The method of claim 17, further comprising increasing the gas pressure of the air compartment when a measured gas pressure of the air compartment is lower than a predetermined value.

19. The method of claim 17, further comprising decreasing the gas pressure of the air compartment when a measured gas pressure of the air compartment is greater than a predetermined value.

20. The method of claim 14, further comprising aligning the flexible material with the photomask by disposing a plurality of pins at the second side of the cover.

\* \* \* \* \*